United States Patent [19]

Kawasaki

[11] Patent Number: 4,710,640

[45] Date of Patent: Dec. 1, 1987

[54] ELECTRON BEAM LITHOGRAPHY

[75] Inventor: Katsuhiro Kawasaki, Katsuta, Japan

[73] Assignee: Hitachi, Ltd., Tokyo, Japan

[21] Appl. No.: 757,285

[22] Filed: Jul. 22, 1985

[30] Foreign Application Priority Data

Jul. 24, 1984 [JP] Japan .................... 59-153703

[51] Int. Cl.⁴ .............................................. H01J 37/00
[52] U.S. Cl. ............................ 250/492.2; 219/121 ER
[58] Field of Search ........... 250/396 R, 492.2, 492.22, 250/398; 219/121 ER

[56] References Cited

U.S. PATENT DOCUMENTS

| 3,894,271 | 7/1975 | Pfeiffer et al. | 219/121 ER |
| 4,151,417 | 4/1979 | Takigawa | 250/492.2 |
| 4,423,305 | 12/1983 | Pfeiffer | 250/492.2 |
| 4,433,384 | 2/1984 | Berrian | 250/492.2 |
| 4,445,041 | 4/1984 | Kelly et al. | 250/396 R |
| 4,494,004 | 1/1985 | Mauer et al. | 250/492.2 |

*Primary Examiner*—Bruce C. Anderson
*Attorney, Agent, or Firm*—Antonelli, Terry & Wands

[57] ABSTRACT

An electron beam lithograhy apparatus capable of uniformly exposing the surface of a sample by an electron beam including a generator for generating the electron beam, members for shaping the electron beam, members for focusing the shaped electron beam on the surface of the sample, devices for permitting the focused electron beam to scan the surface of the sample, and devices for deflecting the electron beam to blank, unblank and blank in turn, wherein when the electrom beam is deflected in one direction, a sequence of blanking, unblanking and blanking is made of the beam.

4 Claims, 9 Drawing Figures (b)

(c)

(a)

(b)

1

ELECTRON BEAM LITHOGRAPHY

BACKGROUND OF THE INVENTION

This invention relates to electron beam lithographies and particularly to an electron beam apparatus suitable for uniformly exposing the area to be exposed, by an electron beam.

In a conventional electron beam lithography, when the electron beam is blanked, a voltage is applied to electrostatic electrodes provided at a position along the electron beam path in synchronism with a lithographing signal, to thereby deflect the electron beam out of the opening of an aperture plate provided in the electron beam path. In addition, when the electron beam is irradiated on a sample, thereby exposing it, the voltage to the electrostatic electrodes is removed in synchronism with the lithographing signal so that the electron beam is released from the blanked state and passed through the opening of the aperture plate to the sample for a predetermined time. Thereafter, the electron beam is again blanked in synchronism with the image signal, thereby making a desired exposure on the sample.

The amount of electron beam irradiated on the sample with respect to time will be described with reference to FIGS. 5(a), 5(b) and 5(c).

When exposure is made at a predetermined point c on the sample by a beam spot of 4 $\mu$m×4 $\mu$m size, the electron beam is moved as indicated by A, B and C (see FIG. 5(b)) in synchronism with a blanking voltage signal V (see FIG. 5(a)), stops at point c for time $t_b$ and again is moved as indicated by C, B and A, completing the exposure. FIG. 5(b) shows the situation in which the beam is moved on the sample. At this time, the amounts of charge, $Q_a$ and $Q_b$ irradiated at points a and b can be expressed as follows:

$$Q_a = J \cdot (t_b + 2t_a) \quad (1)$$

$$Q_b = J \cdot t_b \quad (2)$$

where J is the current value.

Therefore, the difference between the amounts of charge irradiated on points a and b is expressed as $$\Delta Q = Q_a - Q_b = 2Jt_a. \quad (3)$$

If the amount of charge at point a is assumed to be the optimum exposure condition, the amount of charge at point b is $\Delta Q$ short for exposure. Thus, when it is developed through a process, the size at point c is smaller than 4 $\mu$m. On the other hand, when the sensitivity of the photoresist is increased, the optimum exposure condition $Q_a$ decreases and as a result the rate of $\Delta Q$ to $Q_a$ is large. Thus, insufficient exposure will greatly increase the dimensional error.

SUMMARY OF THE INVENTION

Accordingly, it is an object of this invention to provide an electron beam lithography apparatus capable of uniforming exposure of a sample by an electron beam.

According to this invention, there is provided an electron beam lithography apparatus comprising means for generating an electron beam, means for shaping the electron beam, means for focusing the shaped electron beam on a sample to form an image thereon, means for permitting the focused electron beam to scan the sample, and means for deflecting the electron beam to thereby blank and unblank the same, wherein the electron beam is deflected in one direction to be blanked, unblanked and blanked in turn.

BRIEF DESCRIPTION OF THE DRAWINGS

FIGS. 3(a), 3(b) and 3(c) are diagrams to which reference is made in explaining the operation of an electron beam lithography apparatus according to this invention.

DESCRIPTION OF THE PREFERRED EMBODIMENT

Figure 1:
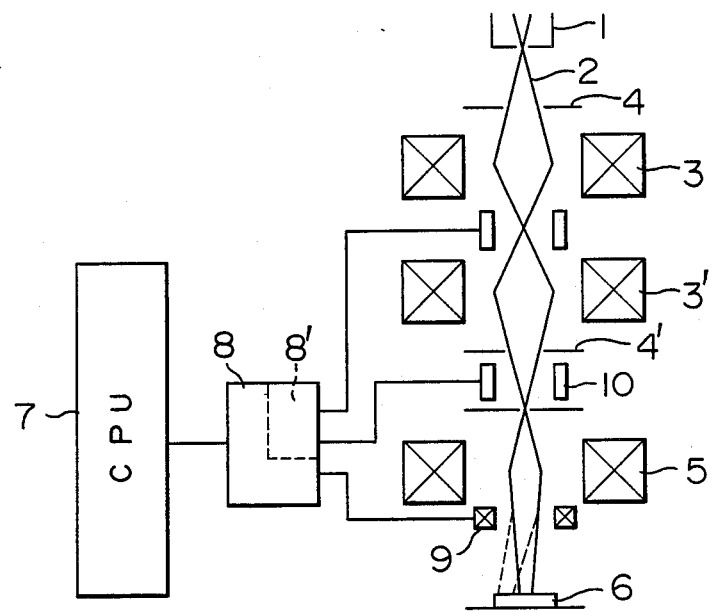
FIG. 1 schematically shows an electron beam lithography apparatus to which this invention is applied.

FIG. 1 schematically shows the construction of an embodiment of an electron beam lithography apparatus according to this invention. Referring to FIG. 1, there is shown an electron gun 1, which emits an electron beam 2. This electron beam 2 passes through a shaping aperture 4 and through shaping lenses 3 and 3' by which the beam is shaped to be rectangular in cross-section. The rectangular-shaped electron beam 2 is further shaped by a shaping aperture 4' and passed through a blanker 10 to a projecting lens 5. The electron beam 2 passed through the projecting lens 5 is deflected to scan the surface of a sample 6 by a deflector 9.

There is also shown a CPU 7, which produces data and supplies it to a lithographing signal generating portion 8. A certain signal from the image signal generating portion 8 is supplied to the blanker 10 as a blanking voltage. Another certain signal from the generator portion 8 is supplied to the deflector 9, thereby deflecting the electron beam to scan the surface of the sample 6.

Figure 2:
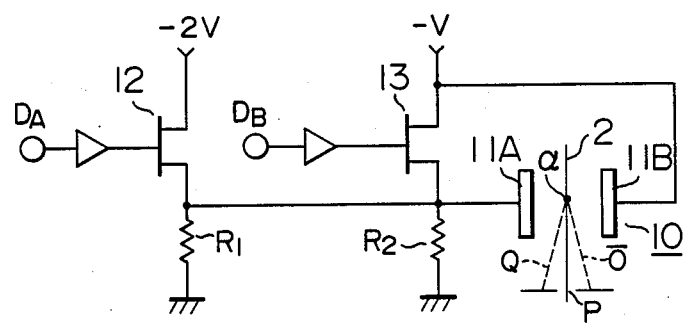
FIG. 2 is a circuit diagram of a main part of one embodiment of this invention.

The voltage applied to the blanker 10 is generated by a circuit 8 which constitutes the image signal generating portion 8 and constructed as shown in FIG. 2. In FIG. 2, a high-level or low-level signal is supplied to terminals $D_A$ and $D_B$ and the terminal $D_A$ is connected to the gate of a switching transistor 12. This switching transistor 12 is connected in series with a resistor $R_1$. One end of the series circuit on the resistor side is grounded and the other end of the series circuit on the transistor side is supplied with a voltage of $-2$ V. The terminal $D_B$ is connected to the gate of a switching transistor 13. This transistor 13 is also connected in series with a resistor $R_2$. One end of the series circuit on the resistor side is grounded, and the other end thereof is supplied with a voltage of $-V$. One electrostatic electrode 11A of the blanker 10 is connected to the junction between the switching transistor 12 and the resistor $R_1$ and to the junction between the switching transistor 13 and the resistor $R_2$. The other electrostatic electrode 11B is connected to the other end of the series circuit of the transistor 13 and the resistor $R_2$, or supplied with the voltage of $-V$.

When in this circuit arrangement of FIG. 2 a high-level signal is supplied to the terminal $D_A$ and a low-level signal to the terminal $D_B$, the electrostatic electrodes 11A ad 11B provides a blanking voltage of −V/2 at the mid point, α between the electrodes (the blanking voltage is expressed by the voltage difference between the electrodes 11A and 11B). Thus, the electron beam is deflected to pass along the orbit of $\overline{O}$, or blanked as shown. Then, when a low-level signal is supplied to the terminal $D_A$ and a high-level signal to the terminal $D_B$, the blanking voltage at point α becomes 0 V, so that the beam is deflected to take the orbit of P, or making exposure as shown. At this time, the electron beam moves on the sample as indicated by F, G and H in FIG. 3(b). For the exposure of the next area K, the blanking voltage is changed as +V/2, 0 V and −V/2, thereby deflecting the electron beam so that it moves in the areas I, J, K. L and M on the sample as shown in FIG. 3(c), thus K being exposed.

Figure 3A:
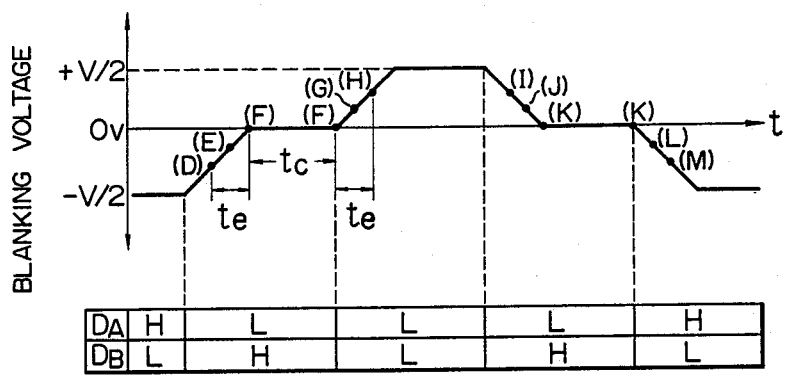
Figure 3A:
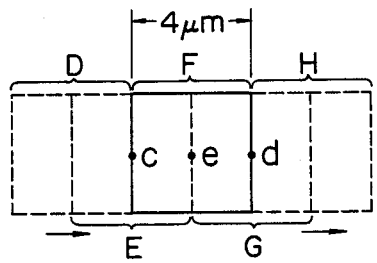
Figure 3A:
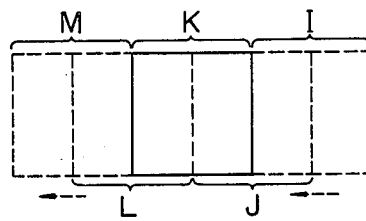

FIG. 3(a) shows the change of the blanking voltage relative to the signal level applied to the terminals $D_A$ and $D_B$.

The amounts of charge, Q at exposure points c and d within F can be expressed as $$Q_c = Q_d = J \cdot (t_e + t_e) \qquad (4)$$

Figure 4:
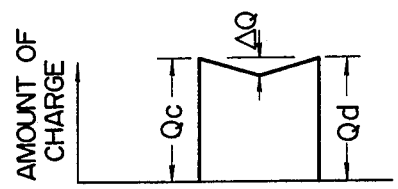
FIG. 4 is a diagram to which reference is made in explaining the effect of the electron beam lithography apparatus according to this invention.
Figure 5:
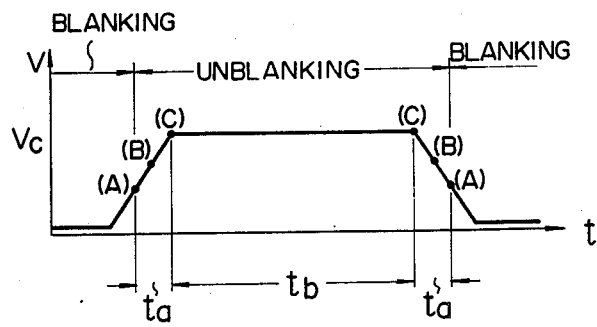
FIGS. 5(a) and 5(b) are diagrams to which reference is made in explaining the operation of a conventional electron beam lithography apparatus.
Figure 5:
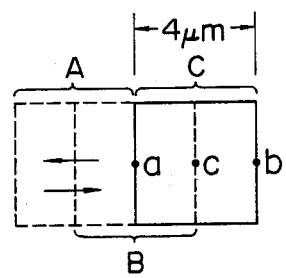
Figure 6:
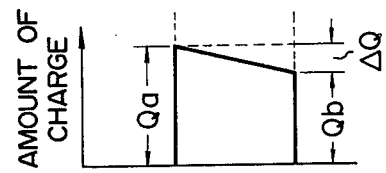
FIG. 6 is a diagram to which reference is made in explaining the drawbacks of the conventional electron beam lithography apparatus.

Thus, the amounts of change at points c and d are equal to each other as shown in FIG. 4. When the optimum exposure condition is $Q_e$ (=$Q_d$), the maximum amount of deviation at point e from $Q_e$ is $$\Delta Q = J \cdot t_e$$

This value is half the amount in the prior art. Therefore, the areas F and K are equally exposed, and hence the dimensional error can be reduced.

As described above, the electron beam lithography apparatus of the invention is constructed to deflect the electron beam in one direction, thereby blanking, unblanking and blanking it in turn. Thus, the surface of the sample can be uniformly exposed by the electron beam.

I claim:

1. An electron beam lithography method comprising the steps of:
    generating an electron beam;
    shaping said electron beam;
    focusing the shaped electron beam on a sample;
    selectively permitting the focused electron beam to pass through aperture means so that the surface of said sample is exposed to the focused electron beam; and
    blanking said electron beam by deflecting said electron beam in one direction to one side of said aperture means, unblanking said electron beam by enabling said electron beam to pass through an aperture of said aperture means, and blanking said electron beam by deflecting said electron beam to the opposite side of said aperture means, respectively, in sequence.

2. An electron beam lithography method according to claim 1, wherein after effecting the sequence of blanking, unblanking and blanking by deflecting said electron beam in said one direction, another sequence of blanking, unblanking and blanking is effected by deflecting said electron beam in the opposite direction to said one direction.

3. An electron beam lithography method according to claim 1, wherein the step of blanking and unblanking effects the sequence of blanking, unblanking and blanking by blanking said electron beam by deflecting said electron beam in said one direction to said one side of said aperture means, unblanking said electron beam by deflecting said electron beam in said one direction so as to enable said electron beam to pass through said aperture of said aperture means, and blanking said electron beam by deflecting said electron beam in said one direction to the opposite side of said aperture means.

4. An electron beam lithography method according to claim 2, wherein the step of blanking and unblanking effects the sequence of blanking, unblanking and blanking by blanking said electron beam by deflecting said electron beam in said one direction to said one side of said aperture of said aperture means, unblanking by deflecting said electron beam in said one direction to enable said electron beam to pass through said aperture of said aperture means, and for blanking said electron beam by deflecting said electron beam to the opposite side of said aperture of said aperture means.

* * * * *